(12) United States Patent
Hayashi et al.

(10) Patent No.: US 9,759,779 B2
(45) Date of Patent: *Sep. 12, 2017

(54) STATE OF CHARGE ESTIMATION DEVICE AND METHOD OF ESTIMATING STATE OF CHARGE

(71) Applicant: GS Yuasa International Ltd., Kyoto-shi (JP)

(72) Inventors: Eiji Hayashi, Kyoto (JP); Masashi Nakamura, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/190,303

(22) Filed: Jun. 23, 2016

(65) Prior Publication Data

US 2016/0299193 A1 Oct. 13, 2016

Related U.S. Application Data

(63) Continuation of application No. 14/183,426, filed on Feb. 18, 2014.

(30) Foreign Application Priority Data

Feb. 20, 2013 (JP) .................................. 2013-030726

(51) Int. Cl.
*H02J 7/00* (2006.01)
*H02J 7/14* (2006.01)
(Continued)

(52) U.S. Cl.
CPC ....... *G01R 31/3624* (2013.01); *G01R 31/361* (2013.01); *H01M 10/48* (2013.01);
(Continued)

(58) Field of Classification Search
USPC ....... 320/132, 134, 136, 149, 122, 127, 133, 320/137; 324/426, 430, 432, 427, 429,
(Continued)

(56) References Cited

U.S. PATENT DOCUMENTS 6,790,540 B2 9/2004 Mori et al.
7,352,156 B2 4/2008 Ashizawa et al.
(Continued)

FOREIGN PATENT DOCUMENTS

JP 2001-091604 A 4/2001
JP 2007-24703 A 2/2007
(Continued)

OTHER PUBLICATIONS

United States Notice of Allowance dated Jul. 6, 2016 in U.S. Appl. No. 14/183,426.
(Continued)

*Primary Examiner* — Alexis Pacheco
(74) *Attorney, Agent, or Firm* — McGinn IP Law Group, PLLC.

(57) ABSTRACT

A state of charge estimation device for estimating a state of charge of iron phosphate lithium ion batteries includes a voltage measurement component configured to measure a voltage across the iron phosphate lithium ion batteries, a current measurement component configured to measure a current flowing through the iron phosphate lithium ion batteries, and a controller component configured to, when an estimation of the state of charge of the iron phosphate lithium ion batteries based on an accumulated amount of currents measured by the current measurement component is defined as a current accumulation method and an estimation of the state of charge of the iron phosphate lithium ion batteries based on an open circuit voltage (OCV) of the iron phosphate lithium ion batteries measured by the voltage (Continued)

measurement component is defined as an OCV method, permit the estimation of the state of charge by the OCV method.

23 Claims, 7 Drawing Sheets

(51) Int. Cl.
  *G01R 31/36*   (2006.01)
  *H01M 10/48*   (2006.01)
  *B60L 11/18*   (2006.01)

(52) U.S. Cl.
  CPC ....... *B60L 11/1861* (2013.01); *G01R 31/3648* (2013.01); *H01M 10/486* (2013.01); *H02J 7/0013* (2013.01); *H02J 7/0016* (2013.01); *H02J 7/0047* (2013.01)

(58) Field of Classification Search
  USPC ........................................................ 324/434
  See application file for complete search history.

(56) References Cited

U.S. PATENT DOCUMENTS

| | | | |
|---|---|---|---|
| 7,733,063 | B2 | 6/2010 | Mizuno |
| 8,274,291 | B2 | 9/2012 | Tsuchiya |
| 8,548,761 | B2 | 10/2013 | Lim et al. |
| 8,577,529 | B2 | 11/2013 | Takahashi et al. |
| 8,645,088 | B2 | 2/2014 | Schaefer |
| 2003/0138663 | A1 | 7/2003 | Mori et al. |
| 2005/0231165 | A1 | 10/2005 | Melichar |
| 2007/0029973 | A1 | 2/2007 | Ashizawa |
| 2009/0001992 | A1 | 1/2009 | Tsuchiya |
| 2010/0131217 | A1 | 5/2010 | Ichikawa |
| 2010/0280777 | A1 | 11/2010 | Jin |
| 2010/0283471 | A1 | 11/2010 | Lim et al. |
| 2011/0213576 | A1 | 9/2011 | Motz et al. |
| 2011/0257914 | A1 | 10/2011 | Tsuchiya |
| 2012/0016547 | A1 | 1/2012 | Aridome |
| 2012/0065824 | A1 | 3/2012 | Takahashi et al. |
| 2012/0091930 | A1 | 4/2012 | Takahashi |
| 2012/0133332 | A1 | 5/2012 | Ogane |
| 2012/0166116 | A1 | 6/2012 | Yoshida et al. |
| 2013/0297243 | A1 | 11/2013 | Baba |
| 2014/0184236 | A1 | 7/2014 | Ohkawa et al. |
| 2014/0232410 | A1* | 8/2014 | Hayashi ............ G01R 31/3624 324/426 |

FOREIGN PATENT DOCUMENTS

| | | |
|---|---|---|
| JP | 2007-178215 A | 7/2007 |
| JP | 2009/005458 A | 1/2009 |
| JP | 2010-283922 A | 12/2010 |
| JP | 2011-515651 A | 5/2011 |
| JP | 2011-515652 A | 5/2011 |
| JP | 4684527 B2 | 5/2011 |
| JP | 2011-106952 A | 6/2011 |
| JP | 2011/257226 A | 12/2011 |
| JP | 2012-500980 A | 1/2012 |
| JP | 2012-057998 A | 3/2012 |
| JP | 2012-137408 A | 7/2012 |
| JP | 2012-149949 A | 8/2012 |
| WO | WO 2012/169061 A1 | 12/2012 |

OTHER PUBLICATIONS

U.S. Office Action dated Mar. 28, 2016 in U.S. Appl. No. 14/183,426.

* cited by examiner

STATE OF CHARGE ESTIMATION DEVICE AND METHOD OF ESTIMATING STATE OF CHARGE

The present application is a Continuation Application of U.S. patent application Ser. No. 14/183,426, filed on Feb. 18, 2014, which is based on and claims priority from Japanese Patent Application No. 2013-030726, filed on Feb. 20, 2013, the entire contents of which are incorporated herein by reference.

FIELD

Technologies described herein relates to a technology for estimating a state of charge of an electric storage device.

BACKGROUND

Examples of methods for estimating states of charge (SOC) of electric storage devices such as a secondary battery include an OCV method in which an open circuit voltage of a secondary battery is used and a current accumulation method in which charge/discharge currents of a secondary battery are accumulated (JP-A-2007-178215). If the current accumulation method is used for calculating an SOC and current accumulation is continued for considerable time, an error in estimation of SOC becomes larger because of an accumulated measurement error of a current sensor. If the current accumulation is assumed to continue for considerable time, it is preferable to use the OCV method for estimating an SOC and reset the accumulated error.

If the accumulated error is reset by estimating the SOC by the OCV method although an error in estimation of SOC by the current accumulation method is smaller than an error in estimation of SOC by the OCV method, the error in estimation of SOC may become larger.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

This specification describes a technology for reducing an error in estimation of SOC of an electric storage device.

A state of charge estimation device for estimating a state of charge of an electric storage device described in this specification includes a voltage measurement component, a current measurement component, and a controller component. The voltage measurement component is configured to measure a voltage across the electric storage device. The current measurement component is configured to measure a current flowing through the electric storage device. The controller component is configured to, when estimation of state of charge of the electric storage device based on an accumulated amount of currents measured by the current measurement component is defined as a current accumulation method and estimation of state of charge of the electric storage device based on an open circuit voltage (OCV) of the electric storage device measured by the voltage measurement component is defined as an OCV method, permit estimation of state of charge by the OCV method when a condition that an error in estimation of state of charge of the electric storage device by the current accumulation method exceeds an error in estimation of state of charge of the electric storage device by the OCV method is satisfied.

BRIEF DESCRIPTION OF DRAWINGS

The foregoing and other features of the present invention will become apparent from the following description and drawings of an illustrative embodiment of the invention in which.

DESCRIPTION OF EMBODIMENTS

Figure 1:
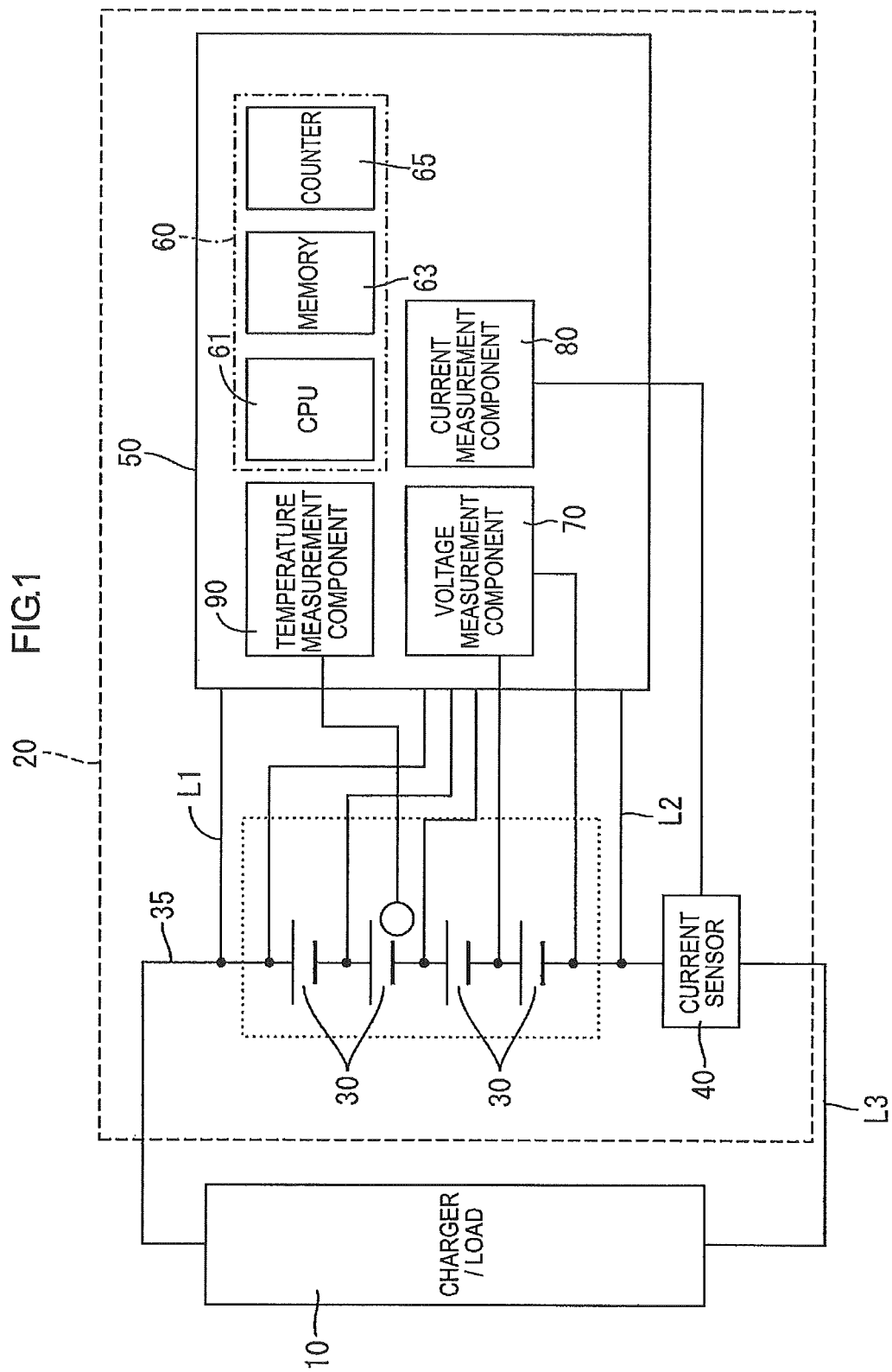
FIG. 1 is a schematic view illustrating a configuration of a battery pack according to an embodiment.

According to a first aspect, there is provided a state of charge estimation device for estimating a state of charge of an electric storage device. The state of charge estimation device includes a voltage measurement component, a current measurement component, and a controller component. The voltage measurement component is configured to measure a voltage across the electric storage device. The current measurement component is configured to measure a current flowing through the electric storage device. The controller component is configured to, when estimation of state of charge of the electric storage device based on an accumulated amount of currents measured by the current measurement component is defined as a current accumulation method and estimation of state of charge of the electric storage device based on an open circuit voltage (OCV) of the electric storage device measured by the voltage measurement component is defined as an OCV method, permit estimation of state of charge by the OCV method when a condition that an error in estimation of state of charge of the electric storage device by the current accumulation method exceeds an error in estimation of state of charge of the electric storage device by the OCV method is satisfied.

According to a second aspect, the condition that the error in estimation of state of charge of the electric storage device by the current accumulation method exceeds the error in estimation of state of charge of the electric storage device by the OCV method is a condition that the accumulated amount of currents since a previous estimation by the OCV method exceeds an accumulated current amount corresponding to the error in the previous estimation by the OCV method.

According to a third aspect, the condition that the error in estimation of state of charge of the electric storage device by the current accumulation method exceeds the error in estimation of state of charge of the electric storage device by the OCV method is a condition that operation time of the state of charge estimation device since a previous estimation by the OCV method exceeds operation time corresponding to the error in the previous estimation by the OCV method.

I According to a fourth aspect, the condition that the error in estimation of state of charge of the electric storage device by the current accumulation method exceeds the error in estimation of state of charge of the electric storage device by the OCV method is a condition that an increase/decrease in remaining capacity of the electric storage device since a previous estimation by the OCV method exceeds an increase/decrease in remaining capacity corresponding to the error in the previous estimation by the OCV method.

According to a fifth aspect, the controller component is configured to: define an estimated state of charge based on estimation based on results of estimation by the current accumulation method and the OCV method with heavier weight assigned to the OCV method when the state of charge estimated by the OCV method is within a specified range in which a variation in open circuit voltage relative to a variation in state of charge is larger than a reference value; and define an estimated state of charge based on estimation results of estimation by the current accumulation method and the OCV method with heavier weight assigned to the current accumulation method when the state of charge estimated by the OCV method is not within the specified range. "To define an estimated state of charge based on estimation based on results of estimation by the current accumulation method and the OCV method with heavier weight assigned to the OCV method" includes a case that the state of charge is estimated by the OCV method and a case that the state of charge is estimated results of estimation by the current accumulation method and the OCV method with a weight heavier than a weight assigned to the current accumulation method is assigned to the OCV method. "To define an estimated state of charge based on estimation based on results of estimation by the current accumulation method and the OCV method with heavier weight assigned to the current accumulation method" includes a case that the state of charge is estimated by the current accumulation method and a case that the state of charge is estimated results of estimation by the current accumulation method and the OCV method with a weight heavier than a weight assigned to the OCV method is assigned to the current accumulation method.

According to a sixth aspect, a state of charge estimation device for estimating a state of charge of an electric storage device described in this specification includes a voltage measurement component, a current measurement component, and a controller component. The voltage measurement component is configured to measure a voltage across the electric storage device. The current measurement component is configured to measure a current flowing through the electric storage device. The controller component configured to: when estimation of state of charge of the electric storage device based on an accumulated amount of currents measured by the current measurement component is defined as a current accumulation method and estimation of state of charge of the electric storage device based on an open circuit voltage (OCV) of the electric storage device measured by the voltage measurement component is defined as an OCV method, define an estimated state of charge based on estimation based on results of estimation by the current accumulation method and the OCV method with heavier weight assigned to the OCV method when the state of charge estimated by the OCV method is within a specified range in which a variation in open circuit voltage relative to a variation in state of charge is larger than a reference value; and define an estimated state of charge based on estimation results of estimation by the current accumulation method and the OCV method with heavier weight assigned to the current accumulation method when the state of charge estimated by the OCV method is not within the specified range.

Technologies described herein can be applied to a state of charge estimation device, a state of charge estimation method, computer programs for implementing functions of the device and the method, and a medium storing the computer programs.

According to the present invention, errors in estimation of state of charge of an electric storage device can be reduced.

First, an overview of a state of charge estimation device according to an embodiment will be provided. In this state of charge estimation device, estimation of state of charge by the OCV method is permitted when a condition that an error in estimation of state of charge by the current accumulation method exceeds an error in estimation of state of charge by the OCV method is satisfied. With this configuration, the estimation by the OCV method is not performed when the error in estimation by the current accumulation method is lower than the error in estimation by the OCV method. Namely, the estimation by the OCV method is not performed at inappropriate timing such that the error becomes larger. Therefore, the error in estimation of SOC can be suppressed.

In the state of charge estimation device, the estimation by the OCV method may be permitted when a condition that the accumulated amount of currents since a previous estimation by the OCV method exceeds an accumulated current amount corresponding to the error in the previous estimation by the OCV method is satisfied. With this configuration, the estimation by the OCV method is not performed as long as the accumulated amount of currents since the previous estimation by the OCV method does not exceed the accumulated current amount corresponding to the error in estimation by the OCV method unless any of other conditions is satisfied.

In the state of charge estimation device, the estimation by the OCV method may be permitted when a condition that operation time of the state of charge estimation device since the previous estimation by the OCV method exceeds operation time corresponding to the error in the previous estimation by the OCV method is satisfied. With this configuration, the estimation by the OCV method is not performed as long as the operation time of the state of charge estimation device since the previous estimation by the OCV method does not exceed the operation time corresponding to the error in the previous estimation by the OCV method unless any of other conditions is satisfied.

In the state of charge estimation device, the estimation by the OCV method may be permitted when a condition that an increase/decrease in remaining capacity of the electric storage device since the previous estimation by the OCV method exceeds an increase/decrease in remaining capacity corresponding to the error in the previous estimation by the OCV method is satisfied. With this configuration, the estimation by the OCV method is not performed as long as the increase/decrease in remaining capacity of the electric storage device since the previous estimation by the OCV method does not exceed the increase/decrease in remaining capacity corresponding to the error in the previous estimation by the OCV method unless any of other conditions is satisfied.

In the state of charge estimation device, the controller component is configured to: define an estimated state of charge based on estimation based on results of estimation by the current accumulation method and the OCV method with heavier weight assigned to the OCV method when the state of charge estimated by the OCV method is within a specified range in which a variation in open circuit voltage relative to a variation in state of charge is larger than a reference value; and define an estimated state of charge based on estimation results of estimation by the current accumulation method and the OCV method with heavier weight assigned to the current accumulation method when the state of charge estimated by the OCV method is not within the specified range. With this configuration, an increase of the error in estimation of state of charge can be suppressed.

An embodiment will be described with reference to FIGS. 1 to 7.

1. Configuration of Battery Pack

FIG. 1 illustrates a configuration of a battery pack 20 of this embodiment. The battery pack 20 will be installed in an electric vehicle or a hybrid vehicle and supply power to an electrically-powered device that operates with electrical energy.

As illustrated in FIG. 1, the battery pack 20 includes secondary batteries (e.g., iron phosphate lithium ion batteries) 30 connected in series, a battery manager (hereinafter referred to as the BM) 50, and a current sensor 40. The BM 50 is configured to manage the secondary batteries 30. The current sensor 40 detects currents flowing through the secondary batteries 30. The BM 50 is an example of a state of charge estimation device. The secondary battery 30 is an example of an electric storage device.

The secondary batteries 30 and the current sensor 40 are connected in series via an electric line 35. The secondary batteries 30 and the current sensor 40 are connected to a charger/load 10. A charger of the charger/load 10 is installed in the electric vehicle. A load of the charger/load 10 may be an electrically-powered device installed in the electric vehicle. The charger of the charger/load 10 has functions of detecting voltages of the secondary batteries 30 and charging the secondary batteries 30.

The BM 50 includes a controller component 60, a voltage measurement component 70, a current measurement component 80, and a temperature measurement component 90. The controller component 60 includes a central processing unit (hereinafter referred to as the CPU) 61, a memory 63, and a counter 65.

The memory 63 stores various programs for controlling operation of the BM 50 (including a battery management program). The CPU 61 performs control processes for components of the battery pack 20 according to programs read out of the memory 63. For example, the CPU 61 executes an SOC estimation sequence, which will be described later. The memory 63 stores data required for executing the SOC estimation sequence, for example, measurements of remaining capacity a3, fully-charged capacity a4, data in a specified range X, threshold data used for determination of OCV method execution condition (the first to the third thresholds), and correlation data containing correlation characteristics between OCV and SOC (a correlation graph in FIG. 2).

The voltage measurement component 70 is connected across each secondary battery 30 via a detection line. The voltage measurement component 70 has a function of measuring a voltage V (V) of each secondary battery 30 at predetermined intervals. The current measurement component 80 has a function of measuring currents flowing through the secondary batteries 30 via the current sensor 40. The temperature measurement component 90 may be a contact-type or a non-contact type thermometer having a function of measure a temperature D (° C.) of the secondary batteries 30 at predetermined intervals.

The battery pack 20 includes an operation component (not illustrated) and a display component (not illustrated). The operation component is configured to receive inputs from a user. The display component is a liquid crystal display configured to display SOCs of the secondary batteries 30 and other information.

Figure 2:
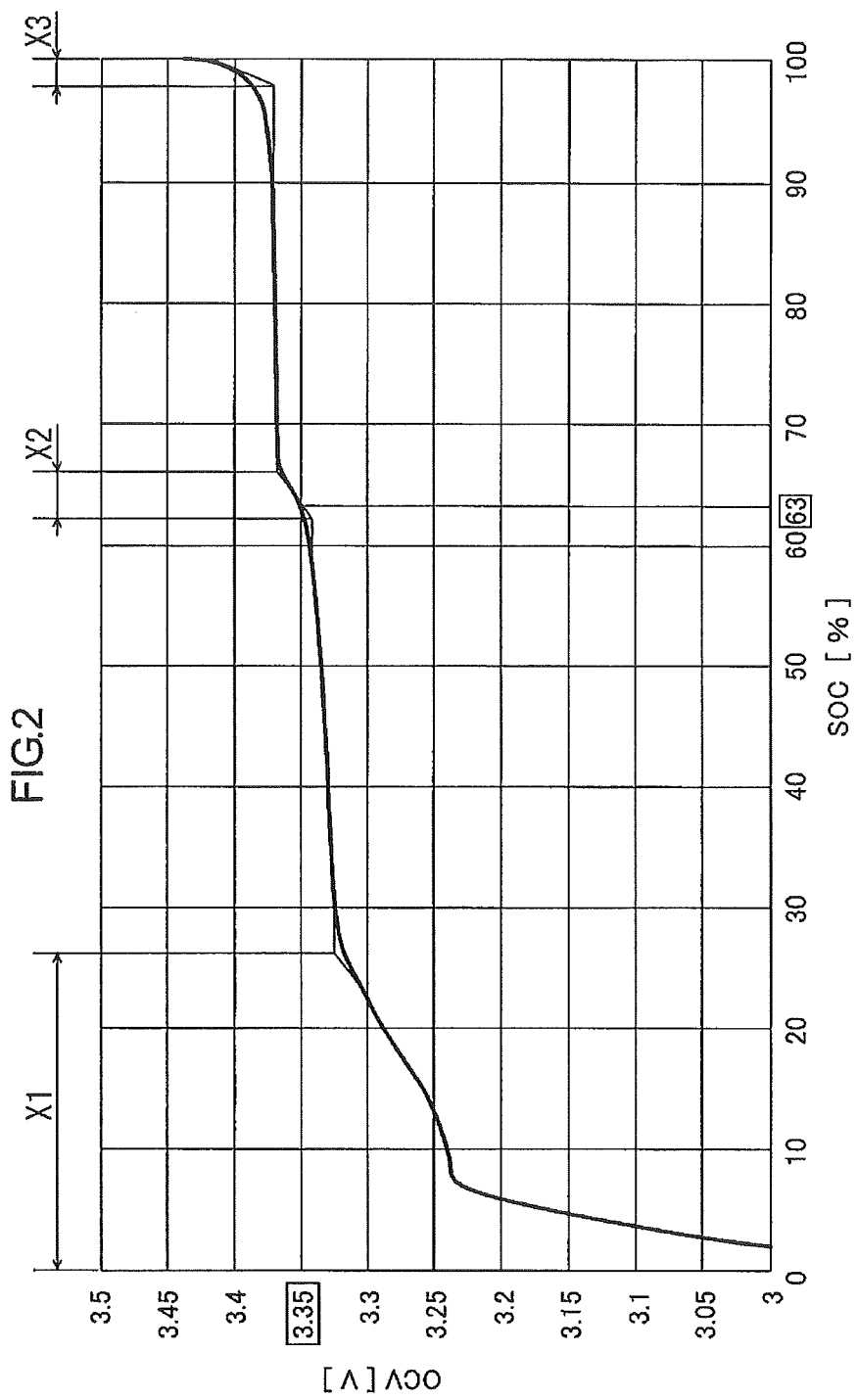
FIG. 2 is a graph illustrating a relationship between SOC and OCV.
Figure 3:
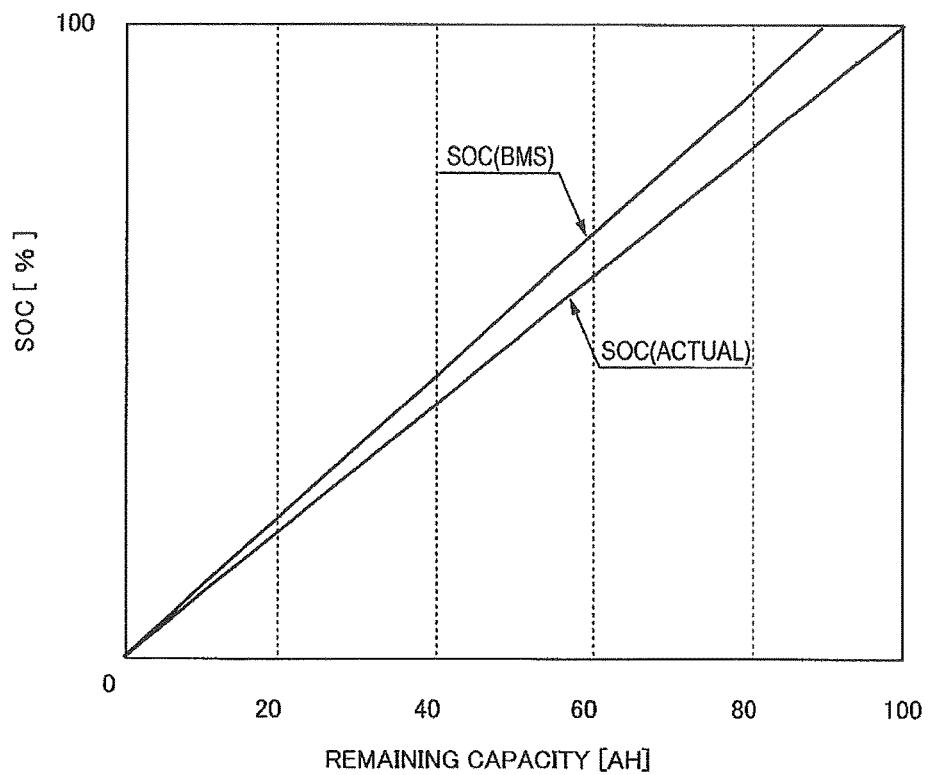
FIG. 3 is a graph illustrating a relationship between actual SOC and SOC calculated by a BM.

2. Error in Estimation of SOC of Secondary Battery 30 Due to Execution Timing of Estimation by OCV Method Methods of estimating states of charge (a state of charge is hereinafter referred to as the SOC) of the secondary batteries 30 include the OCV method and the current accumulation method by which the SOC is estimated based on an accumulated current. The OCV method is a method of estimating the SOC based on an open circuit voltage (hereinafter referred to as the OCV) of the secondary battery 30. In the OCV method, the OCV is measured and the SOC corresponding to the OCV is acquired with reference to the correlation characteristics between OCV and SOC (the SOC-OCV correlation graph illustrated in FIG. 2). FIG. 2 illustrates a graph with SOC on the horizontal axis and OCV on the vertical axis expressing SOC-OCV correlation characteristics of an iron phosphate lithium ion secondary battery including lithium iron phosphate (LiFePO4) as positive active material.

If the SOC is estimated by the current accumulation method and the current accumulation is continued for considerable time, an error in estimation of SOC becomes larger because measurement errors of the current sensor 40 may be accumulated. Therefore, it is preferable to perform the estimation by the OCV method at predetermined timing and reset the accumulated measurement error. Even when the OCV method is used, a measurement error in voltage and an error in correlation graph are observed. If the accumulated error in estimation of SOC is reset by estimating the SOC by the OCV method although an error in estimation of SOC by the current accumulation method is smaller than an error in estimation of SOC by the OCV method, the error in estimation of SOC may become larger.

The BM 50 is configured to permit estimation of SOC by the OCV method in response to determining that a condition that an error in estimation of SOC by the current accumulation method exceeds an error in estimation of SOC by the OCV method is satisfied. With this configuration, the estimation of SOC by the OCV method is not performed at inappropriate timing such that the error becomes larger. Therefore, the error in estimation of SOC can be suppressed.

Conditions to permit estimation of SOC by the OCV method include the following three different conditions: execute permission conditions 1 to 3. The estimation of SOC by the OCV method is permitted in response to determining that any of the execute permission conditions 1 to 3 is satisfied.

(1) Execute Permission Condition 1

The execute permission condition 1 is a condition for determining whether an accumulated amount a1 of currents that accumulated since the previous estimation of SOC by the OCV method exceeds an accumulated amount of currents corresponding to an error in estimation by the OCV method (hereinafter referred to as the first threshold). For example, if a fully-charged capacity of the secondary battery 30 is 100 Ah and an error of the current sensor 40 is 0.1%, an error in estimation of SOC by the current accumulation method is 0.1 Ah when the secondary battery 30 is charged or discharged for 100 Ah. If an error in estimation of SOC by the OCV method is 1%, an error in estimation of SOC by the OCV method is 1 Ah when the secondary battery 30 is charged or discharged for 100 Ah. Namely, the error in estimation of SOC by the current accumulation method becomes larger than the error in estimation of SOC by the OCV method when the secondary battery 30 is charged or discharged for 1000 Ah or more. The accumulated current amount corresponding to the error of 1% in estimation of SOC by the OCV is 1000 Ah. Therefore, the first threshold is set to 1000 Ah in this example.

(2) Execute Permission Condition 2

The execute permission condition 2 is a condition for determining whether operation time of the BM 50 since the previous estimation of SOC by the OCV method is larger than operation time corresponding to the error in estimation of SOC by the OCV method (hereinafter referred to as the second threshold).

Specifically, as illustrated in FIG. 1, power is supplied to the BM 50 from the secondary batteries 30 via lines L1 and L2 other than a line L3 on the charger side, to which the current sensor 40 is connected. Therefore, a measurement by the current sensor 40 does not contain a component of current consumed by the BM 50. When the SOC is estimated by the current accumulation method, a current component consumed by the BM 50 is observed as an error. For example, if an error in estimation of SOC by the OCV method is 1%, an error in estimation of SOC by the OCV method is 1 Ah when the secondary battery 30 is charged or discharged 100 Ah. If the operation time of the BM 50 exceeds 10 hours, the error in estimation of SOC by the current accumulation method exceeds the error in estimation of SOC by the OCV method. Namely, the operation time of the BM 50 corresponds to the error of 1% in estimation of SOC by the OCV method is 10 hours. Therefore, the second threshold is set to 10 hours in this example. The operation time of the BM 50 is time during which the BM 50 operates for determining conditions of the secondary batteries 30 (determining voltages, currents, SOCs and remaining capacities).

(3) Execute Permission Condition 3

The execute permission condition 3 is a condition for determining whether an increase/decrease amount Δa3 in the remaining capacity a3 of the secondary batteries 30 since the previous estimation of SOC by the OCV method exceeds an increase/decrease amount in remaining capacity corresponding to the error in estimation of SOC by the OCV method (hereinafter referred to as the third threshold). The BM 50 stores a value for a fully-charged capacity a4 of the secondary battery 30 smaller than an actual value of the fully-charged capacity a4 to provide a margin of the remaining capacity a3 (so that the secondary battery 30 does not enter a banned region due to an excessive discharge). If the SOC is estimated by the current accumulation method, the error in estimation of SOC increases as the increase/decrease Δa3 in the remaining capacity a3 since the previous estimation of SOC by the OCV method increases.

For example, if the SOC is estimated by the current accumulation method when the secondary battery 30 is charged from 0 Ah of the remaining capacity to 9 Ah under the condition that the fully-charged capacity of the secondary battery 30 is 100 Ah and the value for the fully-charged capacity stored in the BM 50 is 90 Ah, the SOC estimated by the current accumulation method is 10%. However, the actual SOC is 9%. Namely, an error of 1% is observed. The increase/decrease amount AO in the remaining capacity a3 corresponding to the error of 1% in estimation of SOC by the OCV method is 9 Ah. Therefore, the third threshold is set to 9 Ah in this example.

3. SOC Estimation Sequence Executed by BM 50

Figure 4:
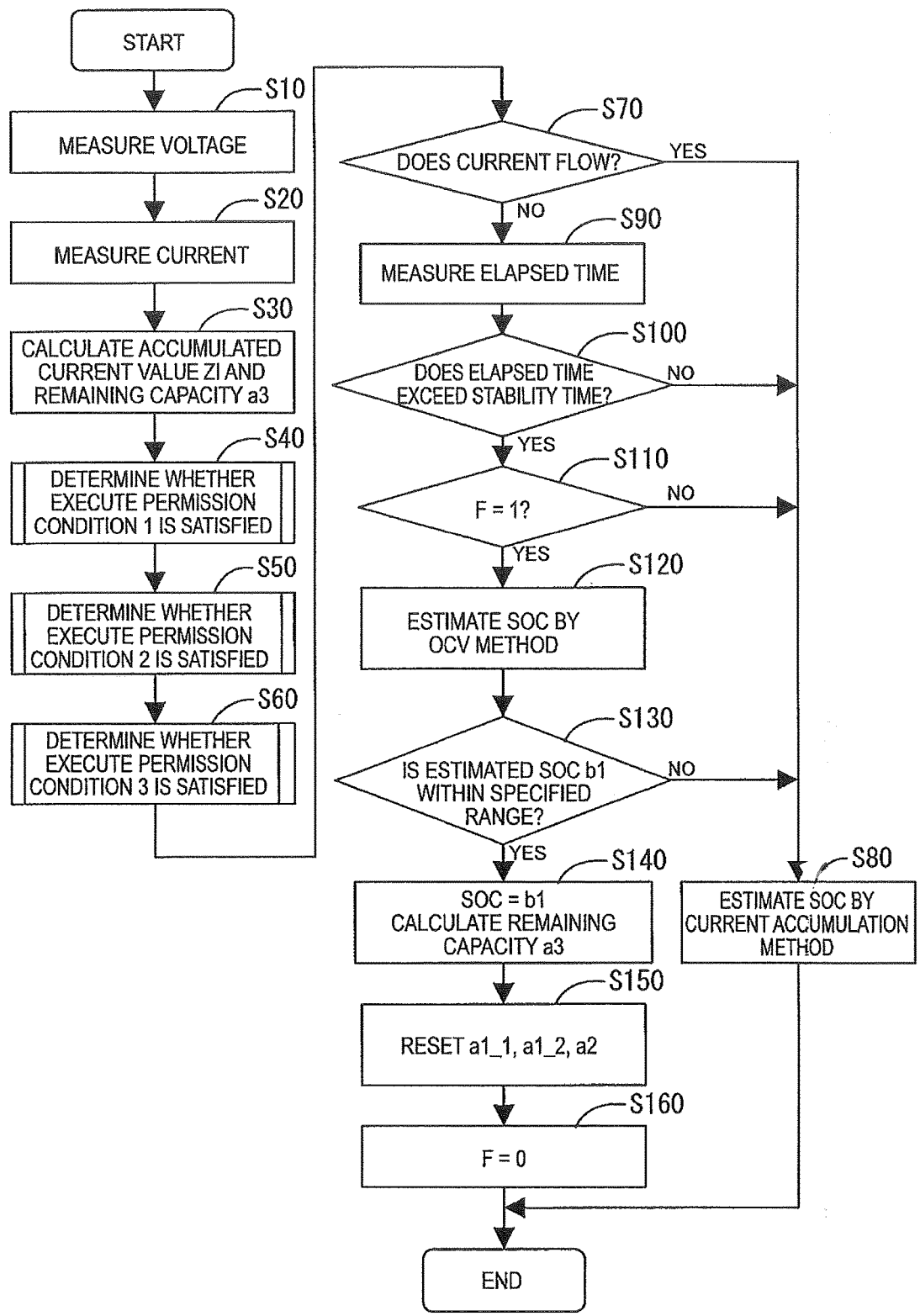
FIG. 4 is a flowchart illustrating an SOC estimation sequence.
Figure 5:
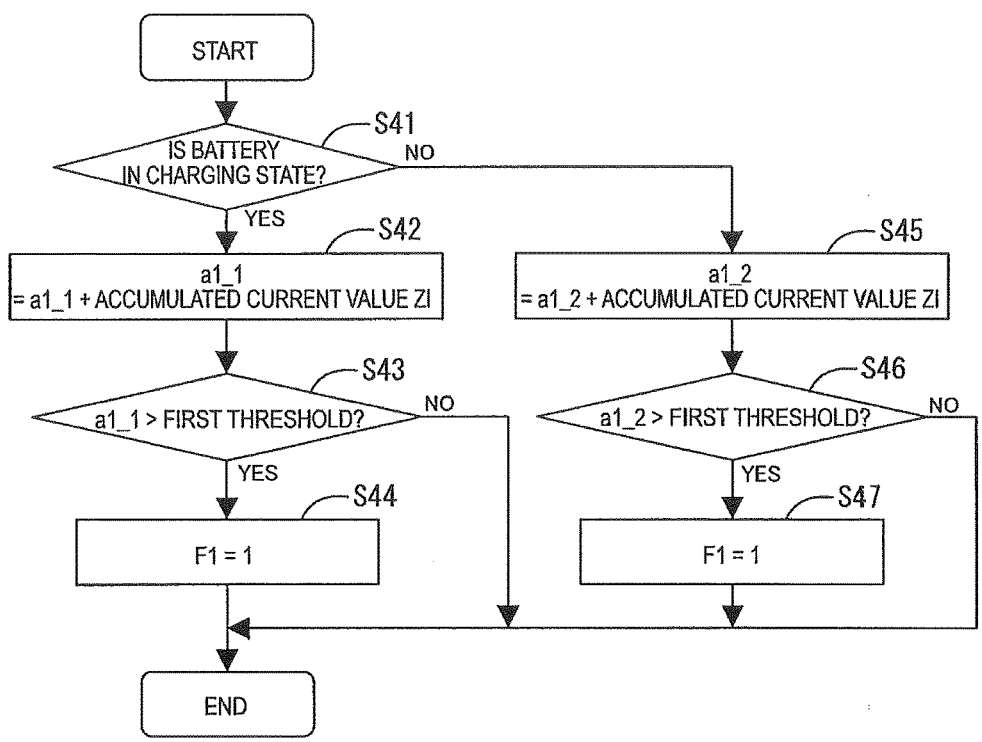
FIG. 5 is a flowchart illustrating determination whether an execute permission condition 1 for permitting estimation of SOC by an OCV method is satisfied.

Next, an SOC estimation sequence for estimating SOC will be described with reference to FIGS. 4 to 7. As illustrated in FIG. 4, the SOC estimation sequence includes sixteen steps, steps S10 to S160. The SOC estimation sequence starts in response to reception of an execution command from an onboard ECU (not illustrated) by the BM 50. After that, a series of steps is repeatedly performed at predetermined intervals T according to commands from the controller component 60. With this configuration, voltages and currents of the secondary batteries 30 are repeatedly measured at predetermined intervals T. Therefore, the SOCs and the remaining capacities a3 of the secondary batteries 30 can be estimated based on the measurements. A flow of the SOC estimation sequence in the case of the secondary battery 30 that is in charging state will be described as an example.

At the beginning of the SOC estimation sequence, the controller component 60 sends a command for voltage measurement to the voltage measurement component 80 and the voltage measurement component 80 measures a voltage across each secondary battery 30 (S10). The controller component 60 sends a command for current measurement to the current measurement component 70 and the current measurement component 70 measures a current that flows through the secondary battery 30 with the current sensor 40 (S20). The voltage measured in step S10 and the current measured in step S20 are converted to digital values and stored in the memory 63.

The controller component 60 proceeds to step S30. In step S30, the controller component 60 calculates an accumulated current value ZI by multiplying the current I measured in step S20 by the predetermined interval T as expressed by Equation 1.

$$ZI = I \times T \quad (1)$$

The controller component 60 calculates the remaining capacity a3 of the secondary battery 30 by adding the accumulated current value ZI obtained through the above calculation to the current remaining capacity a3 as expressed by Equation 2.

$$a3 = a3 + ZI \quad (2)$$

Namely, the remaining capacity a3 is updated every time the SOC estimation sequence is executed by adding the accumulated current value ZI to the previous remaining capacity a3.

After the accumulated current value ZI and the remaining capacity a3 are calculated in step S30, the controller component 60 determines whether execute permission conditions for executing the estimation of SOC by the OCV method are satisfied. As described earlier, three execute permission conditions are defined in this embodiment. The controller component 60 determines whether the execute permission conditions 1 is satisfied in step S40, the execute permission condition 2 is satisfied in step S50, and the execute permission condition 3 is satisfied in step S60.

In the determination of whether the execute permission condition 1 is satisfied (S40), the controller component 60 determines whether the accumulated amount a1 is larger than the first threshold (1000 Ah in this example). The accumulated amount a1 is an amount of currents accumulated since the previous SOC estimation by the OCV method. Step S40 includes seven substeps, steps S41 to S47 illustrated in FIG. 5.

In step S41, the controller component 60 determines whether the secondary battery 30 is in charging state, for example, based on status information provided by the onboard ECU or a direction of the current. In response to determining that the secondary battery 30 is in charging state (YES in step S41), the controller component 60 proceeds to step S42.

In step S42, the controller component 60 calculates an accumulated amount of currents (an accumulated amount a1_1 of currents of the secondary battery 30 that is in charging state in this example). The accumulated amount is an amount of currents accumulated since the previous estimation of SOC by the OCV method. The controller component 60 calculates the accumulated amount a1_1 by adding the accumulated current value ZI to the accumulated amount a1_1 in step S42 as expressed by Equation 3.

$$a1\_1 = a1\_1 + ZI \qquad (3)$$

The reason why the accumulated amount a1_1 can be calculated by Equation 3 is that the previous accumulated amount a1_1 is reset, that is, set to zero in step S150, which will be described later, after the estimation of SOC by the OCV method is performed. Therefore, the currents are accumulated from the initial value of zero after the estimation of SOC by the OCV method is performed.

After the accumulated amount a1_1 is calculated in step S42, the controller component 60 proceeds step S43. In step S43, the controller component 60 determines whether the accumulated amount a1_1 is larger than the first threshold. In response to determining that the accumulated amount a1_1 exceeds the first threshold (YES in step S43), the controller component 60 proceeds to step S44. In step S44, the controller component 60 sets a flag F1 to "1."

In response to determining that the accumulated amount a1_1 is smaller than the first threshold (NO in step S43), the controller component 60 maintains the flag F1 at "0 (default)." The flag F1 is used for indicating whether the estimation of SOC by the OCV method is permitted. If the flag F1 is set to "1," the estimation of SOC by the OCV method is permitted. If the flag F1 is set to "0," the estimation of SOC by the OCV method is prohibited. When the setting of the flag F1 is complete, the determination of whether the execute permission condition 1 is satisfied ends.

In response to determining that the secondary battery 30 is in discharging state (NO in step S41), the controller component 60 proceeds to step S45. In step S45, the controller component 60 calculates an accumulated amount of currents (an accumulated amount a1_2 of currents of the secondary battery 30 that is in discharging state in this example). The accumulated amount is an amount of currents accumulated since the previous estimation of SOC by the OCV method. The controller component 60 calculates the accumulated amount a1_2 by Equation 4.

$$a1\_2 = a1\_2 + ZI \qquad (4)$$

Steps S46 and S47 are performed in the same manner as steps S43 and S44 in the case that the secondary battery 30 is in charging state. In step S46, the controller component 60 determines whether the accumulated amount a1_2 is larger than the first threshold. In response to determining that the accumulated amount a1_2 is larger than the first threshold (YES in step S46), the controller component 60 proceeds to step S47. In step S47, the controller component 60 sets a flag F1 to "1." In response to determining that the accumulated amount a1_2 is smaller than the first threshold (NO in step S46), the controller component 60 maintains the flag F1 at "0 (default)."

After the determination of whether the execute permission condition 1 is satisfied is complete, the controller component 60 determines whether the execute permission condition 2 is satisfied (S50).

In the determination of whether the execute permission condition 2 is satisfied, the controller component 60 determines whether the operation time of the BM 50 since the previous estimation of SOC by the OCV method is larger than the second threshold. The operation time of the BM 50 corresponds to a value calculated by multiplying the number of times a2 at which the BM 50 is operated by the predetermined interval T. In this example, the controller component 60 determines the number of times a2. Then, the controller components 60 determines whether the operation time of the BM 50 is larger than the second threshold based on a comparison between the number of times a2 and the number of times corresponding to the second threshold (hereinafter referred to as the reference number of times). If the predetermined interval T is 100 ms and the second threshold is 10 hours, the reference number of times N is "360000" calculated by Equation 5.

$$N = 10 \times 60 \times 60 \times 10 \qquad (5)$$

Figure 6:
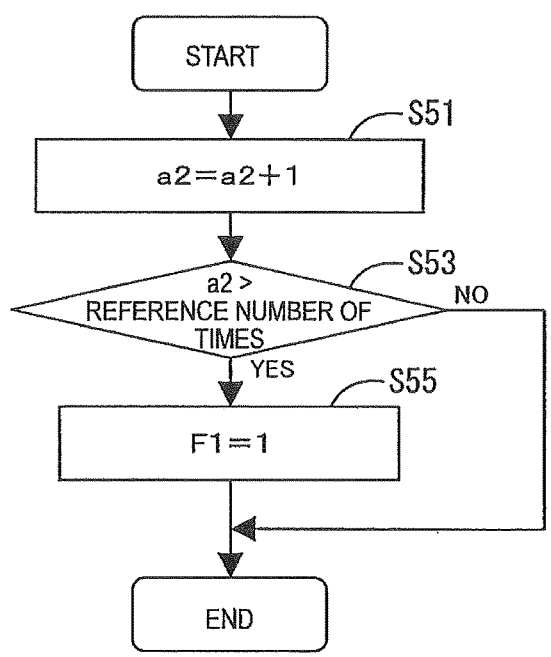
FIG. 6 is a flowchart illustrating determination whether an execute permission condition 2 for permitting estimation of SOC by an OCV method is satisfied.
Figure 7:
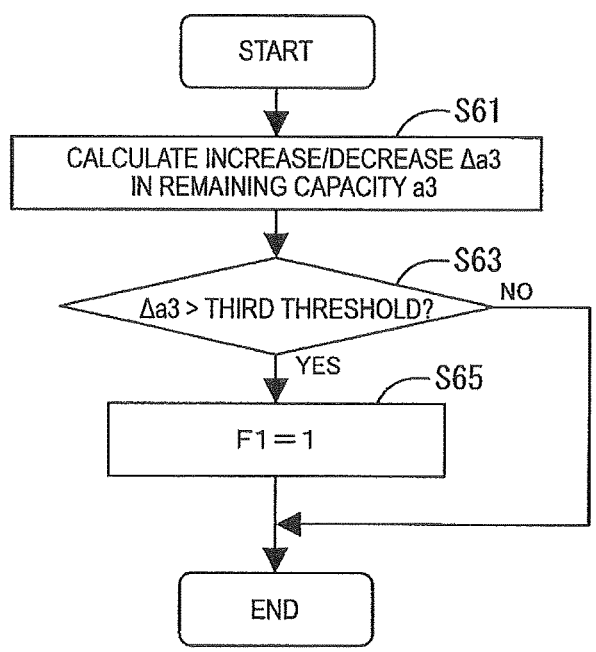
FIG. 7 is a flowchart illustrating determination whether an execute permission condition 3 for permitting estimation of SOC by an OCV method is satisfied.

The determination of whether the execute permission condition 2 is satisfied includes three substeps, steps S51 to S55 illustrated in FIG. 6. In step S51, the controller component 60 calculates the number of times a2 at which the BM 50 is operated since the previous estimation of SOC by the OCV method. Specifically, the controller component 60 adds "1" to the current number of times a2 as expressed by Equation 6. As a result, a new number of times a2 is obtained.

$$a2 = a2 + 1 \qquad (6)$$

The reason why the number of times a2 can be calculated by Equation 6 is that the previous number of times a2 is reset, that is, set to zero in step S150, which will be described later, after the estimation of SOC by the OCV method is performed. Therefore, the number of times is counted from the initial value of zero after the estimation of SOC by the OCV method is performed.

After the number of times a2 is calculated in step S51, the controller component 60 proceeds to step S53. In step S53, the controller component 60 determines whether the number of times a2 is larger than the reference number of times N. In response to determining that the number of times a2 is larger than the reference number of times N (YES in step S53), that is, the operation time of the BM 50 is larger than the second threshold, the controller component 60 proceeds to step S55. In step S55, the controller component 60 sets the flag F1 to "1."

In response to determining that the number of times a2 is smaller than the reference number of times N (NO in step S53), that is, the operation time of the BM 50 is smaller than the second threshold, the controller component 60 maintains the flag F1 at "0 (default)." When the setting of the flag F1 is complete, the determination of whether the execute permission condition 2 is satisfied ends.

After the determination of whether the execute permission condition 2 is satisfied, the controller component 60 determines whether the execute permission condition 3 is satisfied (S60). In this determination, the controller component 60 determines whether a difference AO in the remaining capacity a3 is larger than the third threshold (9 Ah in this example). The step includes three substeps, steps S61 to S65 illustrated in FIG. 7.

In step S61, the controller component 60 calculates an increase/decrease Δa3 in the remaining capacity a3. Specifically, the controller component 60 calculates an absolute value of a result of subtraction of the previous remaining capacity a3_2 from the remaining capacity a3_1 calculated in step S30 as expressed by Equation 7. The previous remaining capacity a3_2 is a remaining capacity at the previous estimation by the OCV method. The result of this calculation is the increase/decrease Δa3 in the remaining capacity a3.

$$\Delta a3 = |a3\_1 - a3\_2| \quad (7)$$

Suffixes 1 and 2 on the symbol a3 represent the remaining capacity a3 based on the estimation by the current accumulation method and the remaining capacity a3 based on the estimation by the OCV method, respectively.

After the increase/decrease Δa3 in the remaining capacity a3 is calculated in step S61, the controller component 60 proceeds to step S63. In step S63, the controller component 60 determines whether the increase/decrease AO in the remaining capacity a3 calculated in step S61 is larger than the third threshold. In response to determining that the increase/decrease Δa3 is larger than the third threshold (YES in step S63), the controller component 60 proceeds to step S65. In step S65, the controller component 60 sets the flag F1 to "1."

In response to determining that the increase/decrease Δa3 is smaller than the third threshold (NO in step S63), the controller component 60 maintains the flag F1 at "0 (default)." When the setting of the flag F1 is complete, the determination of whether the execute permission condition 3 is satisfied ends.

After the determination of whether the execute permission condition 3 is satisfied ends, the controller component 60 proceeds to step S70. In step S70, the controller component 60 determines whether a current flows through the secondary battery 30. Specifically, the controller component 60 determines whether a current flows through the secondary battery 30 based on a comparison between a current measured by the current sensor 40 and a reference value (a value that represents about zero current).

Because the secondary battery 30 is in charging state, the current is supposed to be larger than the reference value. Namely, a result of the determination in step S70 is YES. In response to determining that the current flows through the secondary battery 30 (YES in step S70), the controller component 60 proceeds to step S80. In step S80, the controller component 60 estimates the SOC of the secondary battery 30 by the current accumulation method. Specifically, the controller component 60 divides the remaining capacity a3 calculated in step S30 by the fully-charged remaining capacity a4 stored in the memory 63. As a result, the SOC is obtained.

$$SOC = a3/a4 \quad (8)$$

When step S80 is complete, one cycle of steps is complete. The SOC estimation sequence is repeated at the predetermined intervals T. While the secondary battery 30 is in charging state, steps S10 to S80 are repeated at the predetermined intervals T. The voltage V, the current I, and the remaining capacity a3 of the secondary battery 30 are updated every cycle of the steps (in steps S10 to S30). The accumulated amount a1_1 and the number of times a2, and the increase/decrease Δa3 in the remaining capacity a3 are also updated every cycle of the steps (in steps S40 to S60). The SOC is also estimated by the current accumulation method every cycle of the steps (in step S80).

When the secondary battery 30 is charged and the current I flowing through the secondary battery 30 is smaller than the reference value (the value that represents about zero current), the result of the determination in step S70 is NO. In response to determining that the current I is smaller than the reference value, the controller component 60 proceeds to step S90. In step S90, the controller component 60 measures elapsed time since the current stops flowing through the secondary battery 30 using the counter 65.

After the measurement is complete, the controller component 60 proceeds to step S100. In step S100, the controller component 60 determines whether the elapsed time exceeds stability time (predetermined reference time). The stability time is time required for an open circuit voltage (OCV) of the secondary battery 30 to become stable. When the elapsed time measured in step S90 reaches the stability time, the result of the determination in step S100 is YES. In response to determining that the elapsed time exceeds the stability time, the controller component 60 proceeds to step S110.

In step S110, the controller component 60 determines whether the flag F1 is set to 1. If any of the execute permission conditions 1 to 3 is satisfied, the flag F1 is set to 1. Therefore, the result of the determination in step S110 is YES. In response to determining that the flag F1 is set to 1, the controller component 60 proceeds to step S120.

In step S120, the controller component 60 estimates the SOC of the secondary battery by the OCV method. Specifically, the controller component 60 measures the OCV of the secondary battery 30 (an open circuit voltage when no current flowing through the circuit) with the voltage measurement component 70. Then, the controller component 60 estimates the SOC based on the measured OCV with reference to the correlation characteristics between OCV and SOC illustrated in FIG. 2 (the correlation graph). For example, if the OCV is 3.35 V, an estimated SOC b1 is 63%.

After the estimation is complete, the controller component 60 proceeds to step S130. In step S130, the controller component 60 determines whether the estimated SOC b1 obtained in step S120 is within a specified range X. The specified range X is a range in which a variation in OCV relative to a variation in SOC is large. In this example, three specified ranges X1, X2, and X3 illustrated in FIG. 2 are defined.

A purpose to set the specified ranges X1 to X3 is to accurately estimate the SOC. In ranges outside the specified ranges X1 to X3, variations in OCV relative to variations in SOC are too small for accurate estimation of SOC.

A reference value of a boundary between the specified range X and an adjacent range thereof is determined based on a tolerance of error in estimation of SOC by the OCV method.

For example, on an XY plane of coordinates with the SOC (in 1%) on an X axis (a horizontal axis) and the OCV (in 0.01 V) on a Y axis (a vertical axis), if an error in voltage measurement with the voltage measurement component 70 is ±0.01 V, an error in SOC estimated based on a measurement error in voltage is as follows. If a gradient K of a line in the SOC-OCV correlation graph is 0.01, the estimated error in SOC is ±1%. If the gradient K of the line in the SOC-OCV correlation graph is 0.1, the estimated error in SOC is ±0.10%. If the gradient K of the line in the SOC-OCV correlation graph is 1, the estimated error in SOC is ±0.01%. The gradient is expressed in 0.01 V/%.

When suppression of decrease in accuracy of the estimation by the OCV method with respect to the estimation by the current accumulation method is focused, tolerance of the error corresponds with the measurement error of the current sensor 40 (0.1% in this example). Therefore, the reference value of the gradient K is 0.1. By setting a range larger than 0.1 as the specified range X, the error in estimation of SOC by the OCV method can be suppressed within the tolerance, which is 0.1%. The gradient K of the SOC-OCV correlation graph corresponds to a variation in open circuit voltage (OCV) relative to a variation in SOC.

As illustrated in FIG. 2, if the estimated SOC b1 is 63%, the estimated SOC is within the specified range X2. Therefore, the result of the determination in step S130 is YES. In response to determining that the estimated SOC is within the specified range X2, the controller component 60 proceeds to step S140. In step S140, the controller component 60 determines that the estimated SOC b1 estimated in step S120 as an estimated SOC. The controller component 60 also calculates the remaining capacity a3 of the secondary battery 30 by multiplying the estimated SOC b1 by the fully-charged capacity a4 stored in the memory 63 as expressed by Equation 9.

$$a3 = b1 \times a4 \tag{9}$$

After the calculation is complete, the controller component 60 sets various parameters used for determination on whether the execute permission conditions are satisfied to zero, that is, resets the parameters in step S150. The parameters include the accumulated amounts a1_1 and a1_2 and the number of times a2 at which the BM 50 is operated. In step S160, the controller component 60 sets the flag F1 to zero, that is, resets the flag F1.

The SOC estimation sequence is repeated at the predetermined intervals T. When the second battery 30 is charged or discharged after the sequence, the voltage and the current of the secondary battery 30 are measured in step S10 and step S20, respectively. Furthermore, the remaining capacity a3 of the secondary battery 30 is calculated by the current accumulation method in step S30 using the remaining capacity a3 determined in step S140 as an initial remaining capacity.

Before any of the execute permission conditions 1 to 3 is satisfied, the result of the determination in step S110 is NO. Therefore, the estimation of SOC by the OCV method is prohibited and the estimation of SOC is performed by the current accumulation method (S80). Namely, in the SOC estimation sequence described herein, the estimation of SOC by the OCV method is prohibited as long as the execute permission conditions 1 to 3 are not satisfied, that is, the error in estimation of SOC by the current accumulation method is smaller than the error in estimation of SOC by the OCV method. Therefore, the SOC is estimated by the current accumulation method.

At the point that the error in estimation of SOC by the current accumulation method becomes larger than the error in estimation of SOC by the OCV method, the estimation of SOC by the OCV method is permitted. After that, the SOC and the remaining capacity a3 are estimated by the OCV method. With this configuration, the error accumulated during the estimation of SOC by the current accumulation method can be reset. After the error is reset, the SOC and the remaining capacity a3 of the secondary battery 30 can be estimated by the current accumulation method using the remaining capacity a3 estimated by the OCV method as an initial remaining capacity.

If the estimated SOC b1 estimated by the OCV method is not within the specified range X, the result of the determination in step S130 is NO. Therefore, the controller component 60 proceeds to step S80 and estimates the SOC by the current accumulation method. Namely, the estimated SOC b1 estimated by the OCV method in step S120 is not used as an estimated SOC. Because steps S150 and S160 are not performed in this case, the SOC estimation sequence is continued without resetting the parameters and the flag F1.

4. Effects

In the BM 50, the estimation of SOC by the OCV method is permitted when the condition that the error in estimation of SOC by the current accumulation method is larger than the error in estimation of SOC by the OCV method is satisfied. With this configuration, the estimation of SOC by the OCV method is not performed when the error in estimation of SOC by the current accumulation method is smaller than the error in estimation of SOC by the OCV method. Namely, the estimation of SOC by the OCV method is not performed at inappropriate timing such that the error in estimation becomes larger. Therefore, the error in estimation of SOC can be suppressed.

In the BM 50, the estimation of SOC by the OCV method is permitted when the condition that the accumulated amount a1 since the previous estimation of SOC by the OCV method is larger than the accumulated amount corresponding to the error in estimation of SOC by the OCV method is satisfied. With this configuration, the estimation of SOC by the OCV method is not performed as long as the accumulated amount a1 does not exceed the accumulated amount corresponding to the error in estimation of SOC by the OCV method unless any of other conditions is satisfied. Therefore, the error in estimation of SOC can be suppressed.

In the BM 50, the estimation of SOC by the OCV method is permitted when the condition that the operation time of the BM 50 since the previous estimation of SOC by the OCV method exceeds the operation time corresponding to the error in estimation of SOC by the OCV method is satisfied. With this configuration, the estimation of SOC by the OCV method is not performed as long as the operation time of the BM 50 since the previous estimation of SOC by the OCV method does not exceed the operation time corresponding to the error in estimation of SOC by the OCV method unless any of other conditions is satisfied. Therefore, the error in estimation of SOC can be suppressed.

In the BM 50, the estimation of SOC by the OCV method is permitted when the condition that the increase/decrease Δa3 in the remaining capacity a3 of the secondary battery 30 since the previous estimation of SOC by the OCV method exceeds the increase/decrease in the remaining capacity a3 corresponding to the error in estimation of SOC by the OCV method is satisfied. With this configuration, the estimation of SOC by the OCV method is not performed as long as the increase/decrease Δa3 in the remaining capacity a3 of the secondary battery 30 since the previous estimation of SOC by the OCV method does not exceed the increase/decrease in the remaining capacity a3 corresponding to the error in estimation of SOC by the OCV method unless any of other conditions is satisfied. Therefore, the error in estimation of SOC can be suppressed.

In the BM 50, the estimated SOC estimated by the OCV method is determined as an estimated SOC if the estimated SOC is within the specified range X. If the estimated SOC is not within the specified range X, the estimated SOC estimated by the current accumulation method is determined as an estimated SOC. With this configuration, an increase of the error in estimation of SOC due to the estimation of SOC by the OCV method can be suppressed.

Other Embodiments

The present invention is not limited to the embodiment described above and illustrated in the drawings. The following various embodiments are also included in the technical scope of the present invention.

(1) In the above embodiment, the lithium ion batteries are provided as an example of the electric storage device. However, the technical scope may be applied to secondary batteries other than lithium ion batteries. Furthermore, the technical scope may be applied to capacitors that exhibit electrochemical phenomenon.

(2) In the above embodiment, the CPU 61 is provided as an example of the controller component 60. However, the controller component 60 may be configured to include multiple CPUs or a hardware circuit such as an application specific integrated circuit (ASIC). The controller component 60 may be configured to include both hardware circuit and CPU. Namely, the controller component 60 can have any configuration as long as the controller component 60 executes the SOC estimation sequence through software processing or using a hardware circuit.

(3) In the above embodiment, the SOC estimated by the OCV method is determined as an estimated SOC when the SOC estimated by the OCV method is within the specified range X. However, the SOC may be defined based on results of estimation by the current accumulation method and the OCV method with heavier weight assigned to the OCV method. For example, a weight of 80% may be assigned to the OCV method and a weight of 20% may be assigned to the current accumulation method. In the above embodiment, the SOC estimated by the current accumulation method is determined as an estimated SOC when the SOC estimated by the OCV method is not within the specified range X. However, the SOC may be defined based on results of estimation by the current accumulation method and the OCV method with heavier weight assigned to the current accumulation method. For example, a weight of 20% is assigned to the OCV and a weight of 80% may be assigned to the current accumulation method.

What is claimed is:

1. A state of charge estimation device for estimating a state of charge of iron phosphate lithium ion batteries, the state of charge estimation device comprising:
   a voltage measurement component configured to measure a voltage across each of the iron phosphate lithium ion batteries;
   a current measurement component configured to measure a current flowing through the iron phosphate lithium ion batteries; and
   a controller component configured to, when an estimation of the state of charge of the iron phosphate lithium ion batteries based on an accumulated amount of currents measured by the current measurement component is defined as a current accumulation method and an estimation of the state of charge of the iron phosphate lithium ion batteries based on an open circuit voltage (OCV) of the iron phosphate lithium ion batteries measured by the voltage measurement component is defined as an OCV method, permit the estimation of the state of charge by the OCV method when a condition that an error in the estimation of the state of charge of the iron phosphate lithium ion batteries by the current accumulation method exceeds an error in the estimation of the state of charge of the iron phosphate lithium ion batteries by the OCV method is satisfied such that the iron phosphate lithium ion batteries are then charged by a charger or discharged to a device.

2. The state of charge estimation device according to claim 1, wherein the condition that the error in the estimation of the state of charge of the iron phosphate lithium ion batteries by the current accumulation method exceeds the error in the estimation of state of charge of the iron phosphate lithium ion batteries by the OCV method includes a condition that the accumulated amount of currents since a previous estimation by the OCV method exceeds an accumulated current amount corresponding to the error in the previous estimation by the OCV method.

3. The state of charge estimation device according to claim 1, wherein the condition that the error in estimation of the state of charge of the iron phosphate lithium ion batteries by the current accumulation method exceeds the error in the estimation of the state of charge of the iron phosphate lithium ion batteries by the OCV method includes a condition that an operation time of the state of charge estimation device since a previous estimation by the OCV method exceeds an operation time corresponding to the error in the previous estimation by the OCV method.

4. The state of charge estimation device according to claim 1, wherein the condition that the error in the estimation of the state of charge of the iron phosphate lithium ion batteries by the current accumulation method exceeds the error in the estimation of the state of charge of the iron phosphate lithium ion batteries by the OCV method includes a condition that an increase/decrease in a remaining capacity of the iron phosphate lithium ion batteries since a previous estimation by the OCV method exceeds an increase/decrease in the remaining capacity corresponding to the error in the previous estimation by the OCV method.

5. The state of charge estimation device according to claim 1, wherein the controller component is further configured to:
   define an estimated state of charge based on an estimation based on results of the estimation by the current accumulation method and the OCV method with a heavier weight assigned to the OCV method when the state of charge estimated by the OCV method is within a specified range in which a variation in the open circuit voltage relative to a variation in the state of charge is larger than a reference value; and
   define an estimated state of charge based on estimation results of the estimation by the current accumulation method and the OCV method with a heavier weight assigned to the current accumulation method when the state of charge estimated by the OCV method is not within the specified range.

6. The state of charge estimation device according to claim 1, wherein the iron phosphate lithium ion batteries is configured to be used in a vehicle.

7. The state of charge estimation device according to claim 1, wherein the controller component is further configured to:
   define an estimated state of charge based on an estimation based on results of the estimation by the current accumulation method and the DCV method with a heavier weight assigned to the OCV method when the state of charge estimated by the OCV method is within a specified range in which a variation in the open circuit voltage relative to a variation in the state of charge is larger than a reference value.

8. The state of charge estimation device according to claim 1, wherein the controller component is further configured to:
   define an estimated state of charge based on an estimation based on results of the estimation by the current accumulation method and the OCV method with a different weight assigned to the OCV method when the state of charge estimated by the OCV method is within a specified range in which a variation in the open circuit voltage relative to a variation in the state of charge is larger than a reference value.

9. The state of charge estimation device according to claim 8, wherein the controller component is further configured to:
define an estimated state of charge based on estimation results of the estimation by the current accumulation method and the OCV method with a different weight assigned to the current accumulation method when the state of charge estimated by the OCV method is not within the specified range.

10. The state of charge estimation device according to claim 1, wherein the controller component is further configured to:
define an estimated state of charge based on estimation results of the estimation by the current accumulation method and the OCV method with a heavier weight assigned to the current accumulation method when the state of charge estimated by the DCV method is not within a specified range in which a variation in the open circuit voltage relative to a variation in the state of charge is larger than a reference value.

11. The state of charge estimation device according to claim 9, wherein the controller component is further configured to:
define the estimated state of charge based on an estimation based on results of the estimation by the current accumulation method and the OCY method with a different weight assigned to the OCV method when the state of charge estimated by the OCV method is within the specified range.

12. The state of charge estimation device according to claim 1, wherein the controller component is further configured to:
define an estimated state of charge based on estimation results of the estimation by the current accumulation method and the OCV method with a different weight assigned to the current accumulation method when the state of charge estimated by the OCV method is not within a specified range in which a variation in the open circuit voltage relative to a variation in the state of charge is larger than a reference value.

13. The state of charge estimation device according to claim 1, wherein the controller component is further configured to:
define an estimated state of charge based on an estimation based on results of the estimation by the current accumulation method and the OCV method.

14. The state of charge estimation device according to claim 4, further comprising:
a memory device storing a value for a fully-charged capacity of the iron phosphate lithium ion batteries smaller than an actual value of the fully-charged capacity to provide a margin of the remaining capacity.

15. A state of charge estimation device for estimating a state of charge of iron phosphate lithium ion batteries, the state of charge estimation device comprising:
a voltage measurement component configured to measure a voltage across each of the iron phosphate lithium ion batteries;
a current measurement component configured to measure a current flowing through the iron phosphate lithium ion batteries; and
a controller component configured to:
when an estimation of the state of charge of the iron phosphate lithium ion batteries based on an accumulated amount of currents measured by the current measurement component is defined as a current accumulation method and an estimation of the state of charge of the iron phosphate lithium ion batteries based on an open circuit voltage (OCV) of the iron phosphate lithium ion batteries measured by the voltage measurement component is defined as an OCV method, define an estimated state of charge based on an estimation based on results of estimation by the current accumulation method and the OCV method with a heavier weight assigned to the OCV method when the state of charge estimated by the OCV method is within a specified range in which a variation in the open circuit voltage relative to a variation in the state of charge is larger than a reference value; and
define an estimated state of charge based on estimation results of an estimation by the current accumulation method and the OCV method with a heavier weight assigned to the current accumulation method when the state of charge estimated by the OCV method is not within the specified range such that the iron phosphate lithium ion batteries are then charged by a Charger or discharged to a device.

16. A method of estimating a state of charge of iron phosphate lithium ion batteries, the method comprising:
when an estimation of the state of charge of the iron phosphate lithium ion batteries based on an accumulated amount of currents measured by a current measurement component is defined as a current accumulation method and an estimation of the state of charge of the iron phosphate lithium ion batteries based on an open circuit voltage (OCV) of the iron phosphate lithium ion batteries measured by a voltage measurement component is defined as an OCV method, permitting the estimation of the state of charge by the OCV method when a condition that an error in the estimation of the state of charge of the iron phosphate lithium ion batteries by the current accumulation method exceeds an error in the estimation of the state of charge of the iron phosphate lithium ion batteries by the OCV method is satisfied such that the iron phosphate lithium ion batteries are then charged by a charger or discharged to a device.

17. The method according to claim 16, wherein the condition that the error in the estimation of the state of charge of the iron phosphate lithium ion batteries by the current accumulation method exceeds the error in the estimation of the state of charge of the iron phosphate lithium ion batteries by the OCV method includes a condition that an. increase/decrease in a remaining capacity of the iron phosphate lithium ion batteries since a previous estimation by the OCV method exceeds an increase/decrease in the remaining capacity corresponding to the error in the previous estimation by the OCV method.

18. The method according to claim 16, wherein the iron phosphate lithium ion batteries is configured to be used in a vehicle.

19. The method according to claim 16, further comprising:
defining an estimated state of charge based on estimation based on results of the estimation by the current accumulation method and the OCV method with a heavier weight assigned to the OCV method when the state of charge estimated by the OCV method is within a specified range in which a variation in the open circuit voltage relative to a variation in the state of charge is larger than a reference value.

20. The method according to claim 19, further comprising:

defining an estimated state of charge based on estimation results of the estimation by the current accumulation method and the OCV method with a heavier weight assigned to the current accumulation method when the state of charge estimated by the OCV method is not within the specified range.

21. A state of charge estimation device for estimating a state of charge of batteries, which contains a specific range in which a variation in an open circuit voltage (OCV) relative to a variation in state of charge (SOC) is large, the state of charge estimation device comprising:

a voltage measurement component configured to measure a voltage across each of the batteries;

a current measurement component configured to measure a current flowing through the batteries; and a controller component configured to, when an estimation of the SOC of the batteries based on an accumulated amount of currents measured by the current measurement component is defined as a current accumulation method and an estimation of the state of charge of the batteries based on the OCV of the batteries measured by the voltage measurement component is defined as an OCV method, permit the estimation of the state of charge by the OCV method when a condition that an error in the estimation of the state of charge of the batteries by the current accumulation method exceeds an error in the estimation of the state of charge of the batteries by the OCV method is satisfied such that the batteries are then charged by a charger or discharged to a device.

22. The state of charge estimation device according to claim 21, wherein, if the estimation of the SOC is not within the specific range, the estimation of the SOC estimated by the current accumulation method is determined as an estimated. SOC.

23. The state of charge estimation device according to claim 1, wherein, if the estimation of the SOC is not within a specific range, the estimation of the SOC estimated by the current accumulation method is determined as an estimated SOC.

* * * * *